United States Patent [19]
Kim et al.

[11] Patent Number: 6,122,188
[45] Date of Patent: Sep. 19, 2000

[54] NON-VOLATILE MEMORY DEVICE HAVING MULTI-BIT CELL STRUCTURE AND A METHOD OF PROGRAMMING SAME

[75] Inventors: Eui-Do Kim; Woon-Kyung Lee; Jeong-Hyouk Choi, all of Suwon, Rep. of Korea

[73] Assignee: Samsung Electronics Co., LTD, Rep. of Korea

[21] Appl. No.: 09/219,024

[22] Filed: Dec. 23, 1998

[30] Foreign Application Priority Data

Dec. 31, 1997 [KR] Rep. of Korea ............... 97-80523

[51] Int. Cl.[7] .................................................. G11C 17/00
[52] U.S. Cl. .................. 365/103; 365/94; 365/185.18; 365/185.03
[58] Field of Search .................... 365/185.18, 185.03, 365/94, 103, 128

[56] References Cited

U.S. PATENT DOCUMENTS

| | | |
|---|---|---|
| 4,809,224 | 2/1989 | Suzuki et al. ............... 365/94 |
| 4,907,058 | 3/1990 | Sakai ............................ 257/370 |
| 5,487,033 | 1/1996 | Keeney et al. ............... 365/185.03 |
| 5,541,876 | 7/1996 | Hsue et al. .................. 365/94 |
| 5,594,685 | 1/1997 | Bergemont et al. ......... 365/185.03 |
| 5,598,365 | 1/1997 | Shoji ........................... 365/94 |
| 5,666,307 | 9/1997 | Chang ......................... 365/185.03 |
| 5,736,771 | 4/1998 | Huang et al. ............... 365/94 |
| 5,898,613 | 4/1999 | Diorio et al. ............... 365/185.03 |

*Primary Examiner*—Tan T. Nguyen
*Attorney, Agent, or Firm*—Samuels, Gauthier & Stevens LLP

[57] ABSTRACT

There is provided a non-volatile memory device having a multi-bit cell structure. In the non-volatile memory device, a memory cell array includes a plurality of cells of a first conductivity type which has different threshold voltages and are arranged in a matrix on a semiconductor substrate. A bulk region of a second conductivity type opposite to the first conductivity underlies the memory cell array and receives a predetermined back bias voltage when a cell is driven. The threshold voltage difference between states can be sufficiently widened because a state having a high bulk concentration is highly susceptible to a body effect. Therefore, reduction of masks leads to process simplicity, reduced turnaround time, and improved process margin.

16 Claims, 7 Drawing Sheets

(PRIOR ART)

NON-VOLATILE MEMORY DEVICE HAVING MULTI-BIT CELL STRUCTURE AND A METHOD OF PROGRAMMING SAME

BACKGROUND OF THE INVENTION

1. Field of the Invention

The present invention relates to a non-volatile memory device, and in particular, to a NOR flat cell mask ROM (Read Only Memory) having a multi-bit cell structure, which can achieve process simplicity, reduce turnaround time and ensure process margin.

2. Description of the Related Art

Semiconductor memory devices are largely divided into RAMs (Random Access Memories) and ROMs (Read Only Memories). RAMs are referred to as volatile memories in that data is destroyed with passage of time. RAMs allow rapid data storage and data retrieval. ROMs retain data once it is entered but perform slow data storage and retrieval.

A mask ROM can be categorized as NOR type or NAND type. The NAND cell structure is used for 4- and 16-Mbit mask ROMs because of its feasibility for high integration because it occupies a small cell area, despite a low cell current. A conventional NOR cell offers high-speed operation due to its high cell current but occupies a large cell area. Thus, the NAND cell structure is widely used in prior systems requiring high integration.

However, a NOR flat cell has been recently developed, which dispenses with a field oxide film for isolating devices in a cell array and can be miniaturized to be as small as a NAND cell, while it still has the advantages of the conventional NOR cell. This NOR flat cell advantageously enables high speed and low voltage operation due to high cell current and cell uniformity and facilitates development of a multi-bit cell (MBC) or a multi-level cell (MLC). A conventional cell stores only "0" and "1". By contrast, the multi-bit cell stores several data types such as "00", "01", "10", and "11", to thereby have a data storage capacity twice as large as that of the conventional cell at a conventional cell integration level. Assuming that the conventional cell integration level is n, the conventional data storage capacity is $2^n$. Yet, in the case of a multi-bit cell having four states, each with the cell integration level of n, the data storage capacity is $2^{2n}$. The cell integration level is increased by a factor $2^n$, in effect.

Figure 1:
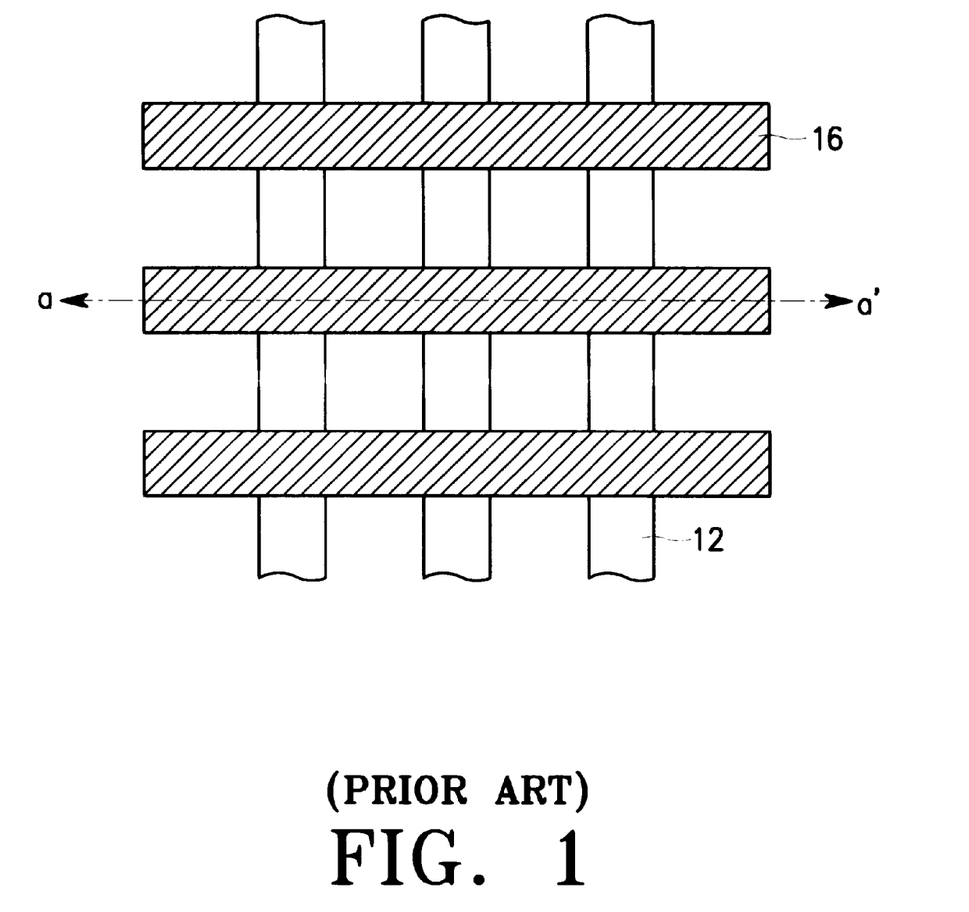
FIG. 1 is a schematic plan view of a conventional NOR flat-cell mask ROM.

FIG. 1 contains a schematic plan view of a conventional NOR flat cell mask ROM. Referring to FIG. 1, the NOR flat-cell mask ROM is a matrix structure in which buried N$^+$ diffusion layers 12, provided as sources/drains and bit lines of cell transistors on the surface of a semiconductor substrate 10, are arranged in a column direction, extending in a row direction. Gate electrodes 16, provided as gate dielectric layers and word lines, orthogonally intersect the buried N$^+$ diffusion layers 12. The width of the gate electrodes 16 is the channel width of the cell transistors, and the distance between buried N$^+$ diffusion layers 12 is the channel length thereof.

In the conventional NOR flat cell mask ROM as mentioned above, data is stored by selectively implementing enhancement ion implantation on a channel area of a cell transistor. The ion implantation generally changes the threshold voltage Vth of the cell transistor. A predetermined voltage is applied to the buried N$^+$diffusion layer provided as a bit line, and a ground voltage is applied to an adjacent bit line to drive the cell. Here, if the voltage on a selected word line is lower than the threshold voltage of the cell transistor, a selected cell turns on and the voltage on the bit line is discharged. Thus, the selected cell is read as "on". On the contrary, if the voltage on the selected word line is higher than the threshold voltage, the selected cell turns off and the voltage on the bit line is maintained. Thus, the selected cell is read as "off".

In an exemplary conventional four-state multi-bit programming, the amount of current discharged from the bit line is estimated to determine data types by varying the threshold voltage of the cell transistor to 0.8V, 2.5V, 4.0V, and 6.0V with the voltage on the selected word line swept to 1.6V, 3.3V, and 5.0V. That is, if the cell turns on with the word line voltages of 1.6V, 3.3V, and 5.0V, it is set to states "00", "01", and "11", respectively. If the cell turns off, it is set to state "10".

A cell threshold voltage distribution of the respective states is significant to multi-bit cell programming in that it determines chip characteristics such as sensing margin and speed. That is, data misreading can be avoided in sensing each state only if the difference between the threshold voltages is large. Yet, since increasing both the threshold voltage of a cell transistor and the word line voltage is limited in terms of processing, the cell threshold voltage distribution should be selected in order to load four states within a predetermined threshold voltage range.

Figure 2:
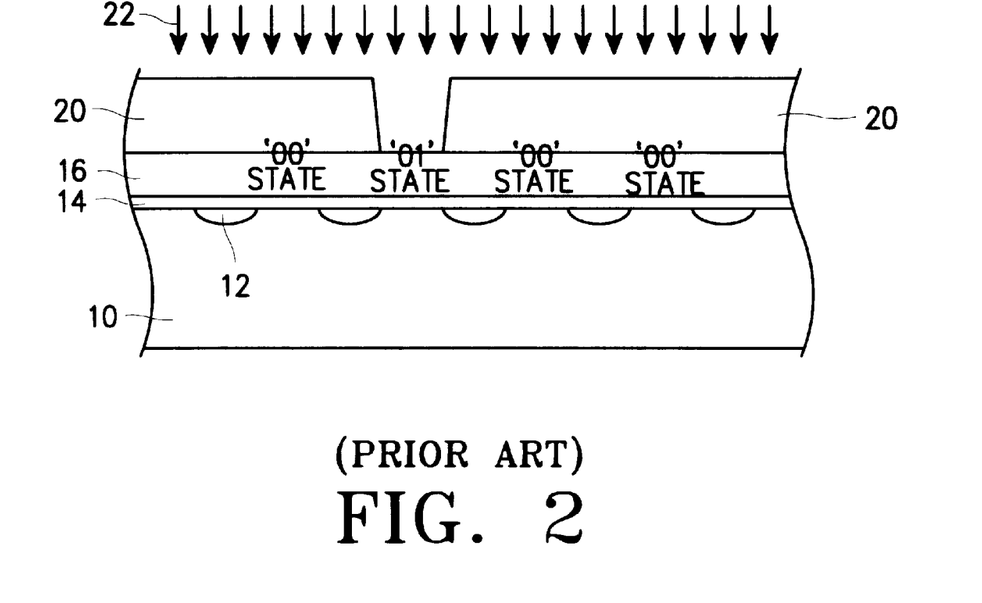
FIGS. 2, 3, and 4 contain schematic sectional views taken along line a–a' of FIG. 1, referred to for describing a conventional multi-bit programming method.
Figure 3:
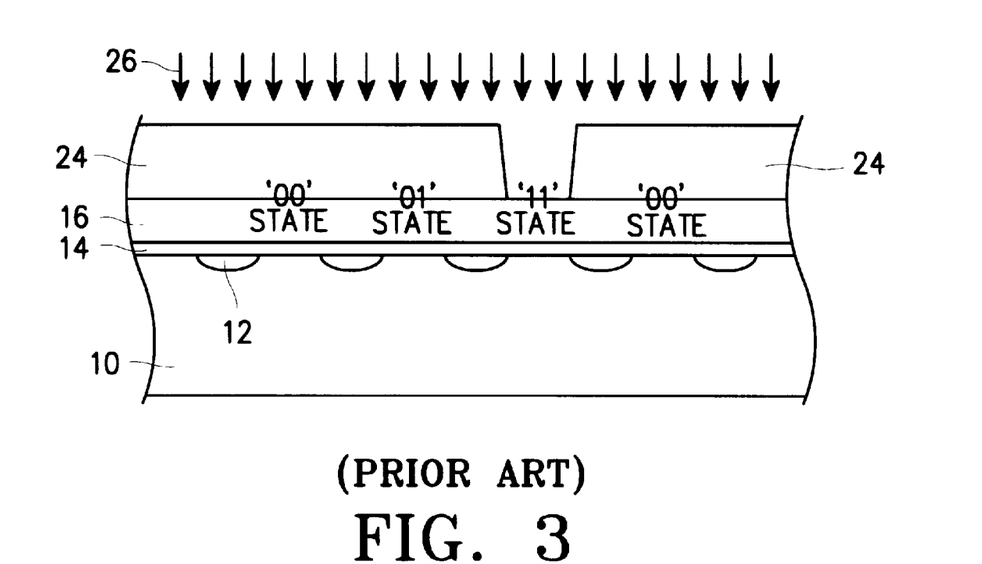
Figure 4:
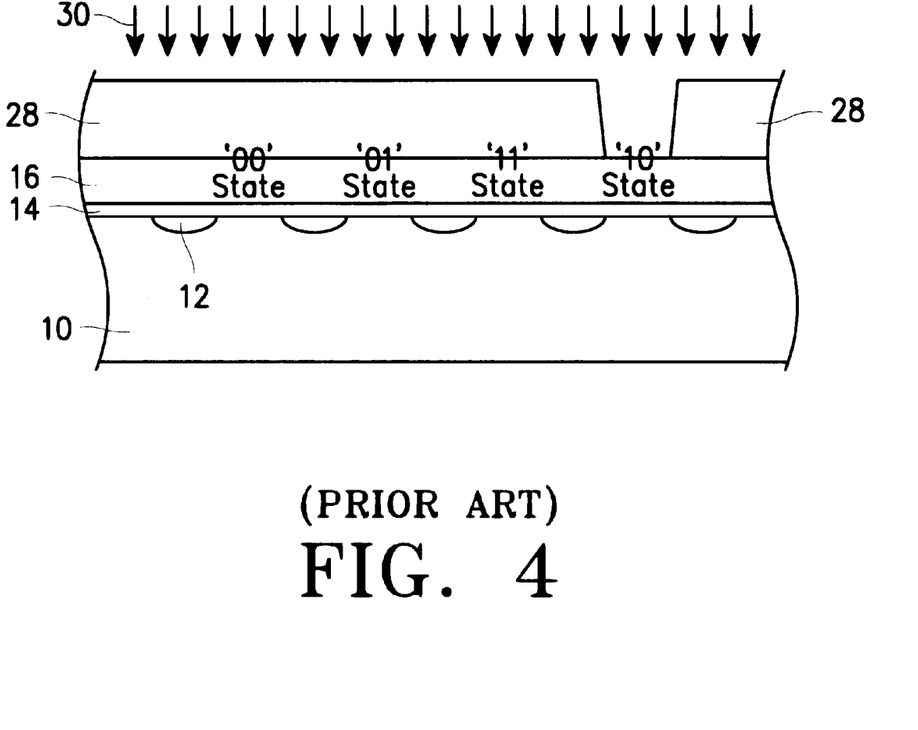

FIGS. 2, 3, and 4 contain schematic sectional views referred to for describing a multi-bit programming method in a conventional flat cell mask ROM. Referring to FIG. 2, a buried N$^+$ diffusion layer 12 is formed on a predetermined area of a P-semiconductor substrate 10, preferably an area for forming a source/drain and a bit line of a cell transistor, by ion implanting an N$^+$ type impurity in an ion implantation and photolithography process. Then, a gate dielectric layer 14 is formed by thermally oxidizing the surface of the substrate 10. A conductive layer for a gate electrode of the cell transistor is formed on the gate dielectric layer 14 by stacking, for example, an impurity-doped polysilicon layer and a metal silicide layer. Subsequently, a gate electrode of a polycide structure, that is, a word line 16, is formed by patterning the metal silicide layer and the polysilicon layer using photolithography.

Following formation of a first photoresist film pattern 20 to open a predetermined cell by photolithography, a first ion implantation is performed by ion implanting a first impurity 22 onto the substrate surface of the exposed cell with the first photoresist film pattern 20 used as an ion implanting mask. As a result, states having an initial threshold voltage, that is, the lowest threshold voltage (hereinafter, referred to as states "00") due to the channel of the cell masked from the programming ion implantation, and states having the third highest threshold voltage (hereinafter, referred to as states "01"), are programmed.

Referring to FIG. 3, after the first photoresist pattern 20 is removed, a second photoresist film pattern 24 is formed by photolithography to perform a second ion implantation. Then, a second impurity 26 is ion implanted on an exposed substrate surface, using the second photoresist film pattern 24 as an ion implanting mask so that the exposed state "00" changes to a state having the second highest threshold voltage (hereinafter, referred to state "11").

Referring to FIG. 4, after the second photoresist film pattern 24 is removed, a third photoresist film pattern 28 is formed by photolithography to perform a third ion implantation. Then, a third impurity 30 is ion implanted on an exposed substrate surface, using the third photoresist film pattern 28 as an ion implanting mask so that the exposed state "00" changes to a state having the highest threshold voltage (hereinafter, referred to a state "10"). Thus, the cell programming is completed.

Figure 5:
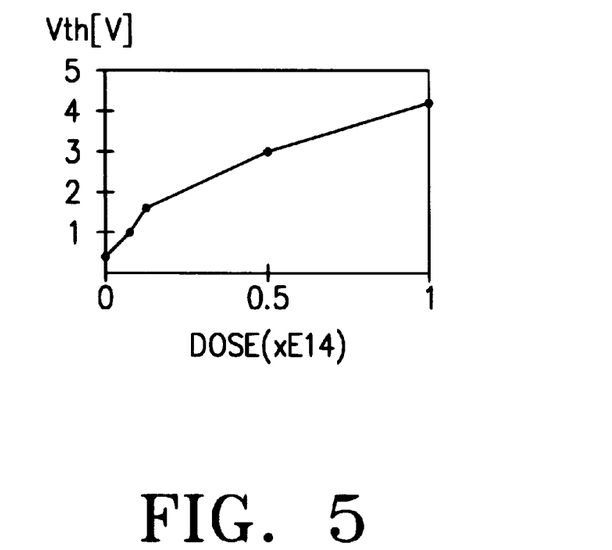
FIG. 5 is a schematic graph showing variations of threshold voltage with the dose of cell ion implantation.
Figure 6:
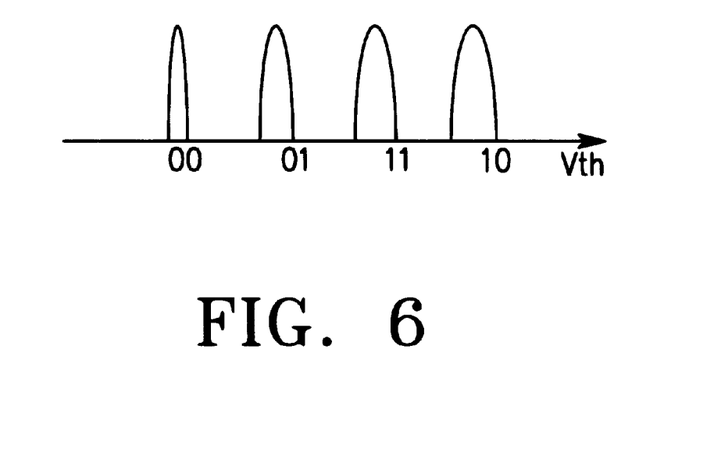
FIG. 6 is a schematic graph showing threshold voltage distributions for respective states in the flat cell mask ROM of FIG. 1.

While the four states "00", "01", "10", and "11" are formed using three masks and three ion implantations in the above conventional multi-bit programming method, two masks and two ion implantations are used in another conventional multi-bit programming method. That is, the states "00" and "10" are formed by first and second ion implantations, respectively, and the state "10" can be formed by appropriately controlling the doses of the first and second ion implantations. In this case, the threshold voltage Vth is not proportional to the dose and saturated at a high dose area despite the increase of dose, as shown in FIG. 5. Therefore, it is difficult to ensure the threshold voltages of the four states are at acceptable levels, especially, cells "10" and "11", which use two ion implantation steps. That is, the threshold voltage of the state "11" may drop below an acceptable level in the second ion implantation for the state "10". On the contrary, the threshold voltage of the state "10" may increase beyond an acceptable level in the second ion implantation for the state "11". Hence, there is difficulty in determining a read voltage for sensing each cell.

Since it is difficult to ensure the threshold voltages for the four states with two masks and two ion implantations as described above, impurities should be ion implanted using a program pattern for each state and three masks to achieve threshold voltages at intended levels. In view of the feature of ROMs, that is, entering data according to user demands prior to complete fabrication of ROMs, the competitiveness of the ROM products depends on how rapidly user demands are satisfied, that is, how short turnaround time is, as well as differential product characteristics. Therefore, an increase in the number of programming masks leads to a long mask fabrication time and adds to masking steps for these ROM products, thereby adversely influencing the turnaround time. In addition, ion implantation should be performed with a high dose to program the states "11" and "10". In this case, the ion implantation is to be performed in several steps because of constraints involved in ion implantation. Furthermore, three critical mask processes for programming may make it difficult to ensure process margin due to layer-to-layer misalignment. The threshold voltage distribution characteristics are deteriorated as the doping level of a channel region increases. Thus, the threshold voltage distribution characteristics of the states "11" and "10" may be deteriorated.

SUMMARY OF THE INVENTION

It is an object of the present invention is to provide a non-volatile memory device having a multi-bit cell structure, in which the threshold voltage of each state can be accurately controlled with a reduced number of masks in order to achieve process simplicity, reduced turnaround time, and process margin.

To achieve the above object, there is provided a non-volatile memory device and a method of programming the device. In the non-volatile memory device, a memory cell array includes a plurality of cells of a first conductivity type which have different threshold voltages and are arranged in a matrix on a semiconductor substrate. A bulk region of a second conductivity type opposite to the first conductivity underlies the memory cell array and receives a predetermined back bias voltage when a cell is driven.

In one embodiment, the bulk region of the second conductivity type is formed on the semiconductor substrate. The bulk region of the second conductivity type can be a well of the second conductivity type formed in the semiconductor substrate. The well of the second conductivity type may be also formed in a transistor area of the first conductivity type in a peripheral circuit region for driving the cell.

According to another aspect of the present invention, there is provided a non-volatile memory device. In the non-volatile device, a memory cell array has a plurality of repeatedly extended buried diffusion layers, e.g., $N^+$ diffusion layers, a plurality of word lines orthogonally intersecting the buried diffusion layers, and a plurality of cells of a first conductivity type having different threshold voltages and arranged in a matrix on a semiconductor substrate. A bulk region of a second conductivity type opposite to the first conductivity underlies the memory cell array and receives a predetermined back bias voltage when a cell is driven.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 7:
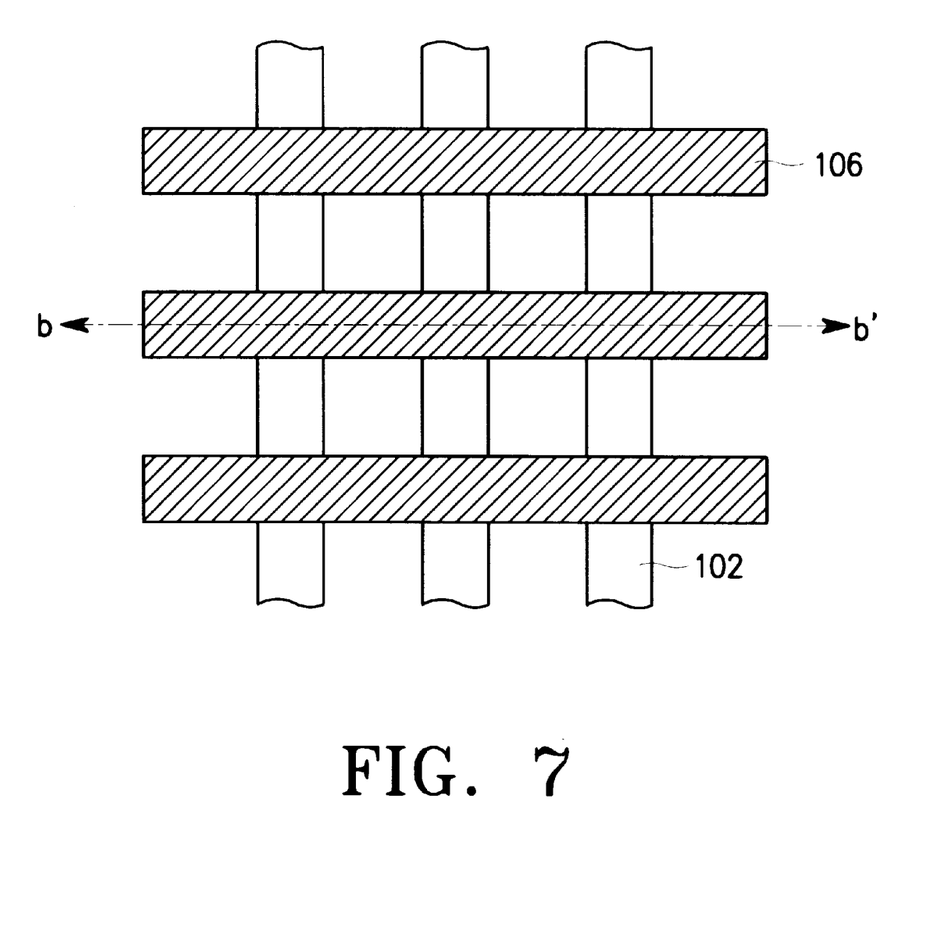
FIG. 7 contains a schematic plan view of one embodiment of a NOR flat cell mask ROM according to the present invention.

FIG. 7 is a plan view of one embodiment of a NOR flat cell mask ROM according to the present invention. Referring to FIG. 7, the NOR flat-cell mask ROM is a matrix structure in which buried $N^+$ diffusion layers 102 are arranged in a column direction extending in a row direction. The diffusion layers are provided as sources/drains and bit lines of cell transistors on the surface of a semiconductor substrate 100. Gate electrodes 106, provided as gate dielectric layers and word lines, intersect the buried $N^+$ diffusion layers 102 as shown. The width of the gate electrodes 106 is the channel width of the cell transistors, and the distance between buried $N^+$ diffusion layers 102 is the channel length thereof.

Figure 8:
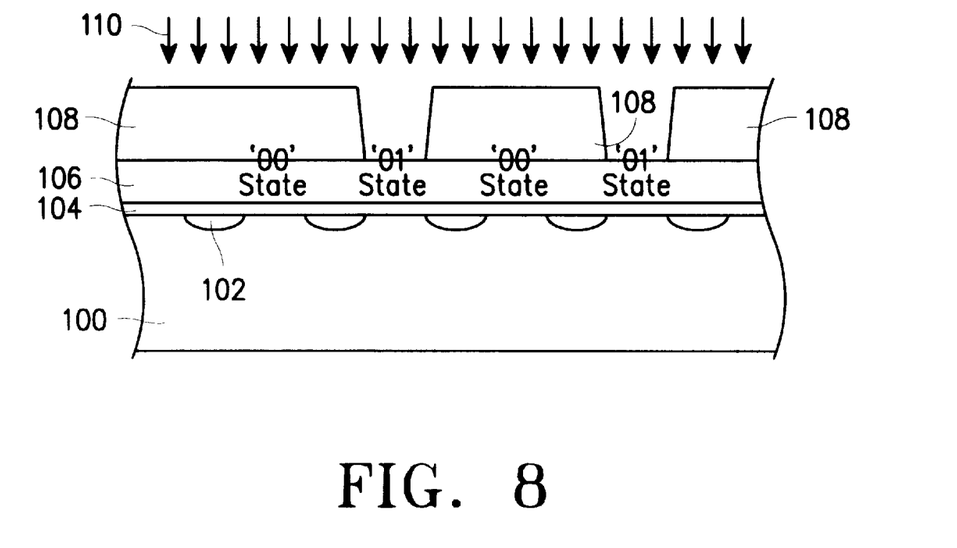
FIGS. 8 and 9 contain schematic sectional views taken along line b–b' of FIG. 7, referred to for describing a multi-bit programming method, in accordance with the present invention.
Figure 9:
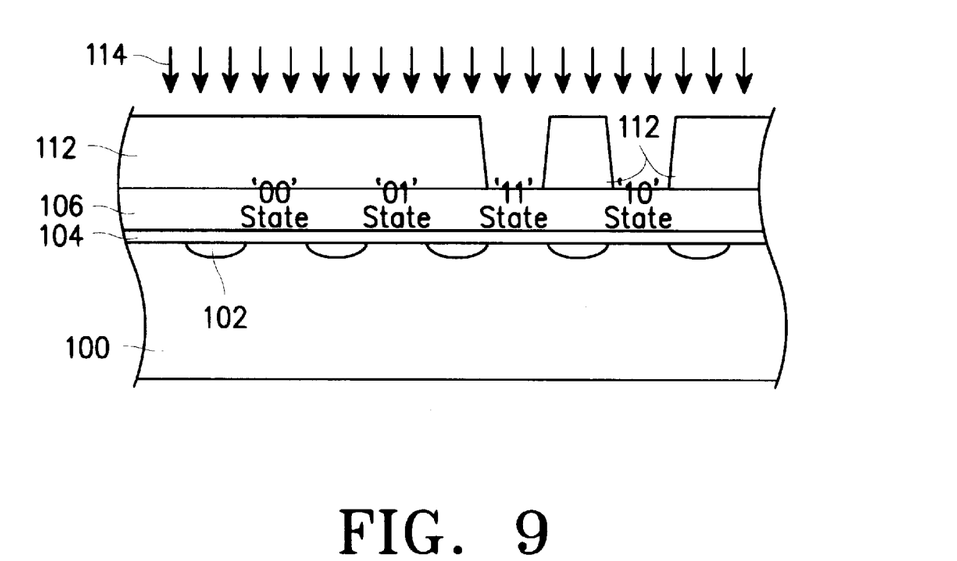

FIGS. 8 and 9 contain schematic sectional views taken along line b–b' of FIG. 7, referred to for describing a multi-bit programming method in the NOR flat cell mask ROM according to the present invention. FIG. 8 illustrates the step of performing a first ion implantation. An N type impurity is ion implanted on the surface of a PA-type semiconductor substrate (not shown) by photolithography and ion implantation, and then diffused to an intended depth by high temperature heat treatment, to thereby form an N-well (not shown). Subsequently, a P type impurity is ion implanted on the surface of the substrate except for the N well, that is, in a memory cell array area and an N-channel transistor area of a peripheral circuit region by photolithography and ion implantation, and then diffused to an intended depth by high temperature heat treatment, to thereby form a P-well 100. According to another embodiment of the present invention, the memory cell array and the N-channel transistor of the peripheral circuit region may be directly formed on the P-substrate without forming the P well. According to a third embodiment of the present invention, the P-well 100 can be surrounded by the N-well in the memory cell array region, that is, a pocket P-well can be employed.

Then, a buried $N^+$ junction 102 is formed by ion implanting an N type impurity in a predetermined area of the P-well 100, preferably, an area for forming a source/drain and a bit line of a cell transistor therein by photolithography and ion implantation. A gate dielectric layer 104 is then formed by thermally oxidizing the overall surface of the substrate. Subsequently, an impurity-doped polysilicon layer is formed as a conductive layer for a gate electrode on the gate dielectric layer 104. A metal silicide layer is deposited on the polysilicon layer to reduce the resistance of the gate electrode. Then, a gate electrode 106 is formed as a polycide structure by patterning the silicide layer and the polysilicon layer by photolithography.

Following formation of a first photoresist film pattern 108 to open specific cells by photolithography, a first ion implantation is performed by ion implanting a first impurity 110 on the exposed cell area with a low dose using the first photoresist film pattern 108 as an ion implanting mask. As a result, a state having the lowest threshold voltage and a state having the third highest threshold voltage, that is, the states "00" and "01", are programmed. Here, opening a channel region to subject the channel region to ion implantation results in the state "01", and covering the channel region with the first photoresist film pattern 108 leads to the state "00".

FIG. 9 illustrates the step of performing a second ion implantation. After the first photoresist film pattern 108 is removed, a second photoresist film pattern 112 is formed by photolithography, for the second ion implantation. Then, in order to selectively program the states "00" and "01" into the states "11" and "10", respectively, a second impurity 114 is ion implanted into exposed cell areas with a low dose, using the second photoresist film pattern 112 as an ion implanting mask. Here, the fourth state "10" results from subjecting a specific cell area to the two ion implantations for forming the states "01" and "11".

According to another embodiment of the present invention (not shown), cells "00" and "11" may be programmed in the first ion implantation and cells "01" and "10" may be programmed in the second ion implantation.

Figure 10:
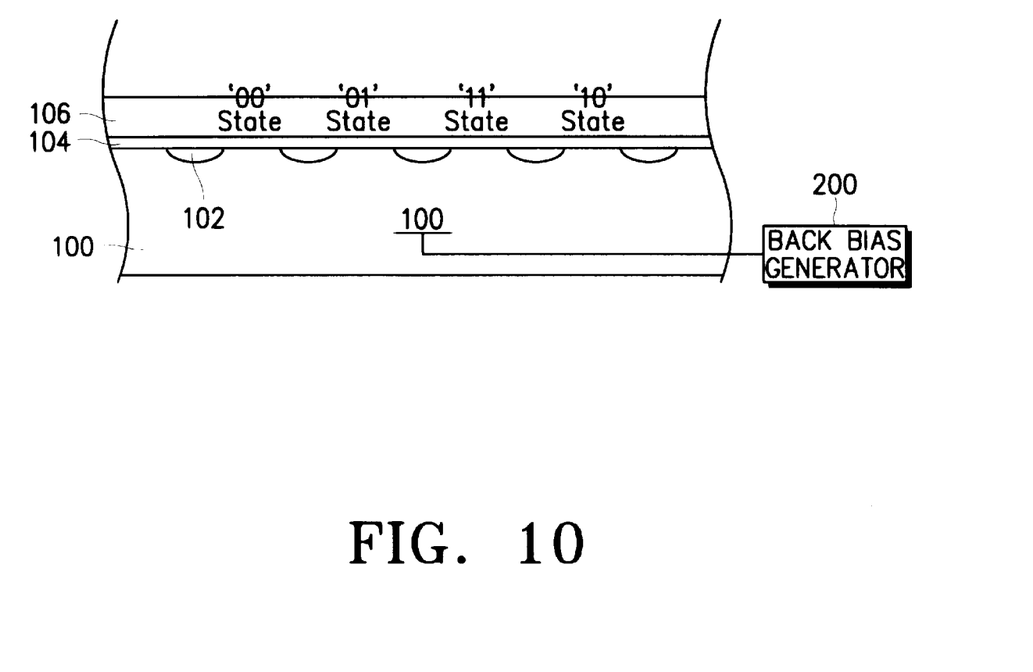
FIG. 10 is a schematic sectional view referred to for describing one embodiment of a NOR flat cell mask ROM driving method according to the present invention.

FIG. 10 is a schematic sectional view taken along line b–b' of FIG. 7, referred to for describing a flat cell mask ROM driving method. Referring to FIG. 10, a predetermined back bias voltage is applied to a bulk region, that is, the P-well 100 of the memory cell array by a back bias generator 200 in the flat cell mask ROM fabricated in the steps of FIGS. 8 and 9. Since a state having a high bulk concentration is generally vulnerable to a body effect (variation of a threshold voltage caused by a bias between a source region and a bulk region), its threshold voltage can be increased to a large extent. Thus, the threshold voltage of each state may be adjusted to an intended level by applying a back bias voltage as described above.

Figure 11A:
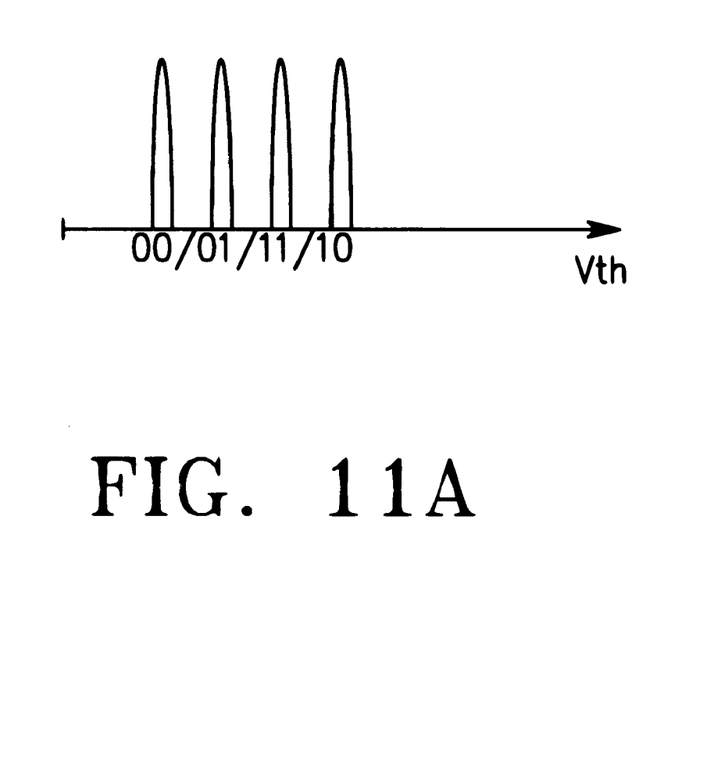
FIGS. 11A and 11B are schematic graphs showing a threshold voltage for each state in the flat cell mask ROM in accordance with the present invention, before and after application of a back bias voltage, respectively.
Figure 11B:
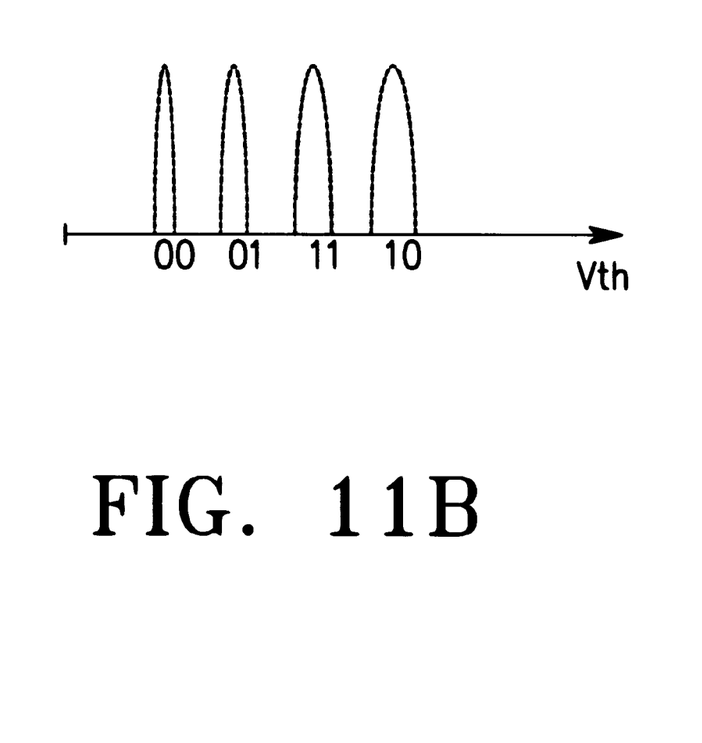

FIGS. 11A and 11B are graphs showing the threshold voltage of each state before and after application of the back bias voltage, respectively, in the flat cell mask ROM of the present invention. As shown in FIGS. 11A and 11B, the difference between the threshold voltages of the states "11" and "10" can be sufficiently widened due to different body effects made on the states by applying a back bias voltage to the P-well 100. To ensure desired multi-bit programming characteristics, the initial threshold voltage of the state "00" is lowered within a punching-free range, and the threshold voltages of the four states are kept apart from one another by lowering the impurity concentration during two ion implantations. In accordance with equation 1 below, a program ion implantation is desirably performed in a lightly doped area in order to keep threshold voltage increments constant with respect to the increase of the bulk concentration.

$$V_{th} = V_{fb} + V_c + 2[\Phi_P] + \left(\frac{1}{Cox}\right)(2\varepsilon_s qNa(2|\Phi_P| + V_c - V_b))^{1/2}, \quad (1)$$

where Na indicates the bulk concentration (i.e., well concentration) is in the root term. In addition, to increase the influence of the bulk concentration on threshold voltage variations, the gate dielectric layer 104 may be made thicker by reducing a dielectric layer capacitance Cox. In this case, the threshold voltage increments with respect to the doping concentration in the programming ion implantation can be almost constant in a lightly doped area.

After the four states are formed using two masks and two ion implantations, the threshold voltages of the four states can be adjusted to desired levels by applying a back bias voltage to the P-well 100. Here, though the threshold voltage difference between the states "11" and "10" is initially smaller than that between the states "00" and "01", it can become wider because a state is vulnerable to a body effect as its threshold voltage increases and the threshold voltage increment between the former states is larger than that between the latter states at the same back bias voltage. Since the threshold voltage difference between states can be adjusted according to the level of a back bias, the threshold voltages can be set to intended levels in consideration of a pumping capability during a pumping operation for sweeping a word line.

Meanwhile, though a threshold voltage distribution after application of a back bias voltage is inferior to that before application of the back bias voltage, formation of the four states at a low doping level during the programming ion implantations minimizes the threshold voltage distribution, thus allowing distribution characteristics similar to the conventional ones.

According to another embodiment of the present invention, a back bias voltage is also applied to the bulk region of an N-channel transistor in a peripheral circuit region when driving a cell, by use of a P-well underlying a memory cell array and a P-well for forming the N-channel transistor in the peripheral circuit region. Therefore, the threshold voltage of the N-channel transistor is increased by the back bias voltage, which enables a design rule for the N-channel transistor to be reduced. As a result, the entire chip size can be decreased.

According to the present invention as described above, the four states "0", "01", "10", and "11" are formed by ion implantation with a low dose using two masks, and a predetermined back bias voltage is applied to a bulk region underlying a memory cell array when a cell is driven. The threshold voltage difference between states can be sufficiently widened because a state having a high bulk concentration is highly susceptible to a body effect. Therefore, intended multi-bit programming characteristics can be achieved by use of two masks, leading to process simplicity, reduced turnaround time, and improved process margin.

While this invention has been particularly shown and described with reference to the preferred embodiments thereof, it will be understood by those skilled in the art that various changes in form and details may be made without departing from the spirit and scope of this invention as defined by the appended claims.

What is claimed is:

1. A masked read-only memory (ROM) device comprising:
    a memory cell array comprising a plurality of cells arranged in a matrix on a semiconductor substrate, said plurality of cells being of a first conductivity type and having different predetermined threshold voltages, each of said cells having a channel region containing ion implanted impurities at a predetermined impurity concentration, said predetermined impurity concentrations of the cells programming the cells to have the different predetermined threshold voltages; and
    a bulk region of a second conductivity type underlying the memory cell array, for receiving a predetermined back bias voltage when a cell is driven.

2. The masked read-only memory (ROM) device of claim 1, wherein the bulk region of the second conductivity type is formed on the semiconductor substrate.

3. The masked read-only memory (ROM) device of claim 1, wherein the bulk region of the second conductivity type is a well of the second conductivity type formed in the semiconductor substrate.

4. The masked read-only memory (ROM) device of claim 3, wherein the well of the second conductivity type is also formed in a transistor area of the first conductivity type in a peripheral circuit region for driving the cell.

5. The masked read-only memory (ROM) device of claim 1 wherein:
    the first conductivity type is N-type; and
    the second conductivity type is P-type.

6. A masked read-only memory (ROM) device comprising:
    a memory cell array including a plurality of buried diffusion layers, a plurality of word lines orthogonally intersecting the buried diffusion layers, and a plurality of cells arranged in a matrix on a semiconductor substrate, said plurality of cells being of a first conductivity type and having different predetermined threshold voltages, each of said cells having a channel region containing ion implanted impurities at a predetermined impurity concentration, said predetermined impurity concentrations of the cells programming the cells to have the different predetermined threshold voltages; and
    a bulk region of a second conductivity type underlying the memory cell array for receiving a predetermined back bias voltage when a cell is driven.

7. The masked read-only memory (ROM) device of claim 6 wherein the buried diffusion layers are $N^+$ diffusion layers.

8. The masked read-only memory (ROM) device of claim 6, wherein the bulk region of the second conductivity type is formed on the semiconductor substrate.

9. The masked read-only memory (ROM) device of claim 6, wherein the bulk region of the second conductivity type is a well of the second conductivity type formed in the semiconductor substrate.

10. The masked read-only memory (ROM) device of claim 9, wherein the well of the second conductivity type is also formed in a transistor area of the first conductivity type in a peripheral circuit region for driving the cell.

11. The masked read-only memory (ROM) device of claim 6 wherein:
    the first conductivity type is N-type;
    the second conductivity type is P-type.

12. A method of programming a masked read-only memory (ROM) device comprising:
    providing a memory cell array having a plurality of cells of a first conductivity type arranged in a matrix on a semiconductor substrate;
    doping each of the cells such that each of the cells has a channel region containing an ion implanted impurity at a predetermined impurity concentration, said impurity concentrations of the cells programming the cells to have different predetermined threshold voltages; and
    applying a predetermined back bias voltage to a bulk region of a second conductivity type underlying the memory cell array.

13. The method of claim 12, wherein the bulk region of the second conductivity type is formed on the semiconductor substrate.

14. The method of claim 12, wherein the bulk region of the second conductivity type is a well of the second conductivity type formed in the semiconductor substrate.

15. The method of claim 14, wherein the well of the second conductivity type is also formed in a transistor area of the first conductivity type in a peripheral circuit region for driving the cell.

16. The method of claim 12 wherein:
    the first conductivity type is N-type; and
    the second conductivity type is P-type.

* * * * *